United States Patent
Steimer et al.

(10) Patent No.: US 6,337,512 B1
(45) Date of Patent: Jan. 8, 2002

(54) SEMICONDUCTOR MODULE

(75) Inventors: Peter Steimer, Unterehrendingen; Alexander Stuck, Wettingen; Hansruedi Zeller, Birr; Raymond Zehringer, Muttenz, all of (CH)

(73) Assignee: ABB Research Ltd., Zürich (CH)

( * ) Notice: Subject to any disclaimer, the term of this patent is extended or adjusted under 35 U.S.C. 154(b) by 0 days.

(21) Appl. No.: 09/535,744

(22) Filed: Mar. 27, 2000

(30) Foreign Application Priority Data

Mar. 31, 1999 (DE) ......................... 199 14 815

(51) Int. Cl.⁷ .......................... H01L 23/13; H01L 23/14
(52) U.S. Cl. ................. 257/700; 257/701; 257/703; 257/706; 257/707; 257/712; 257/717; 257/723
(58) Field of Search ................. 257/700, 701, 257/703, 706, 707, 712, 717, 723; 174/250, 261; 29/840

(56) References Cited

U.S. PATENT DOCUMENTS

| | | | | |
|---|---|---|---|---|
| 3,483,444 A | * | 12/1969 | Parrish | 257/723 |
| 4,450,471 A | * | 5/1984 | Wellhoefer et al. | 257/717 |
| 5,291,065 A | * | 3/1994 | Arai et al. | |
| 5,367,196 A | * | 11/1994 | Mahulikar et al. | 257/787 |
| 5,407,865 A | | 4/1995 | Glovatsky et al. | |
| 5,461,774 A | * | 10/1995 | Holmes et al. | |
| 5,486,720 A | * | 1/1996 | Kierse | 257/659 |
| 5,508,560 A | * | 4/1996 | Koehler et al. | 257/730 |
| 5,536,972 A | * | 7/1996 | Kato | |
| 5,608,267 A | * | 3/1997 | Mahulikar et al. | 257/796 |
| 5,793,106 A | * | 8/1998 | Yasukawa et al. | 257/712 |
| 5,986,218 A | * | 11/1999 | Muto et al. | |

FOREIGN PATENT DOCUMENTS

| | | |
|---|---|---|
| JP | 6-077350 | 3/1984 |
| JP | 62-039030 | 2/1987 |
| JP | 1-204453 | 8/1989 |

OTHER PUBLICATIONS

R. Zehringer, et al., "Material Requirements for High Voltage, High Power IGBT Devices," Materials Research Society Symposium Proceedings, vol. 483, 1998, pp. 369–380.
Thermacore Inc., "Electrically Isolated Power Cooler," Power Electronics, Feb. 17, 1998, p. 65.#jf139##

*Primary Examiner*—Nathan Flynn
*Assistant Examiner*—Kevin Quinto
(74) *Attorney, Agent, or Firm*—Oblon, Spivak, McClelland, Maier & Neustadt, P.C.

(57) ABSTRACT

A semiconductor module having a base element, at least one insulation element arranged on the base element, and at least one semiconductor element arranged on the insulation element. The insulation element has a metal layer on one side and another metal layer on the opposite side. At least one of the metal layers is curved or has curved portions. As a result, it is possible to minimize excessive field increases in the edge zones and increase the dielectric strength of the semiconductor module.

8 Claims, 2 Drawing Sheets

SEMICONDUCTOR MODULE

TECHNICAL FIELD

The invention relates to the field of power electronics. It relates to a semiconductor module according to the preamble of patent claim 1.

PRIOR ART

A semiconductor module of this type is disclosed for example in R. Zehringer et al., Materials Research Society Symposium Proceedings, Volume 483, Power Semiconductor Materials and Devices, 1998, pp. 369–380. This publication describes, as is illustrated in the accompanying FIG. 1, a semiconductor module having a module housing 1, a metallic base plate 2 and a plurality of semiconductor elements 6 which are arranged thereon and are covered by the module housing, said semiconductor elements in this case being IGBT chips (Insulated Gate Bipolar Transistor) and diodes. The module housing is generally filled with a gel composition 7, which serves as an electrical insulation layer and affords protection against corrosion and also reduces tensile forces acting on connecting wires.

The base plate is connected to a water cooling arrangement 20 in order to dissipate the heat generated by the semiconductor elements. A substrate in the form of a metal-coated ceramic plate 3 is arranged on the base plate. It forms electrical insulation between semiconductor elements and base plate or water cooling arrangement and additionally has good thermal conductivity in order to dissipate the heat from the semiconductor elements to the base plate. The base plate, ceramic plate and semiconductor elements are soldered one on top of the other, the metal layers 4, 5 of the ceramic plate enabling the soldered connection.

It is possible nowadays to combine good thermal conductivity and poor electrical conductivity in materials, with the result that producing insulation elements which are relatively thin but have good thermal conductivity, for example ones made of aluminum nitride (AlN), with a good electrical insulation capability, does not pose any difficulties. Thus, in theory, a thickness of between 1.5 and 2 mm suffices to insulate 20 kV.

Edge effects, in particular caused by edges and corners of the metal layers, have a disadvantageous effect, however, on the dielectric strength of the semiconductor module, in particular in the case of high-power semiconductor modules above 1200 V. Edges and corners of the metal layers have an inhomogeneous, intensified electric field. This excessive field increase leads to partial discharges and limits the dielectric strength of the entire construction. In this case, the field strength at the edges is at least the square of the voltage, with the result that massively thicker electrical insulation would be necessary to avoid such partial discharges. Air bubbles that may be produced precisely in the edge zones when gel is filled into the module housing promote partial discharges and form an additional critical factor with regard to the functionality of the semiconductor module.

SUMMARY OF THE INVENTION

The object of the invention, therefore is to provide a semiconductor module of the type mentioned in the introduction which has an improved dielectric strength.

This object is achieved by a semiconductor module having the features of patent claim 1.

In the case of the semiconductor module according to the invention, at least one of the metal layers is designed to be curved, as a result of which, even in edge regions, an electric field which is as homogeneous as possible is obtained and excessive field increases are minimized.

In a first embodiment, at least one of the metal layers is curved in the shape of a well, the distance from a second metal layer arranged on the opposite side of the insulation element increasing toward the edges, thereby reducing an excessive field increase in the edge region.

In a second embodiment, the curved portion is formed by bead-shaped terminations, preferably with a round cross section, at corners and/or edges. In a preferred variant, the insulation element has depressions for accommodating at least the protruding beads. If the entire metal layer is incorporated into the insulation element, with the result that it forms a plane surface with the latter, it is possible to prevent air bubbles from being formed during the gel filling process, since small cavities having poor accessibility are avoided.

Further advantageous embodiments emerge from the dependent patent claims.

BRIEF DESCRIPTION OF THE DRAWINGS

The subject matter of the invention is explained in more detail below using preferred exemplary embodiments which are illustrated in the accompanying drawings, in which.

WAYS OF EMBODYING THE INVENTION

Figure 1A:
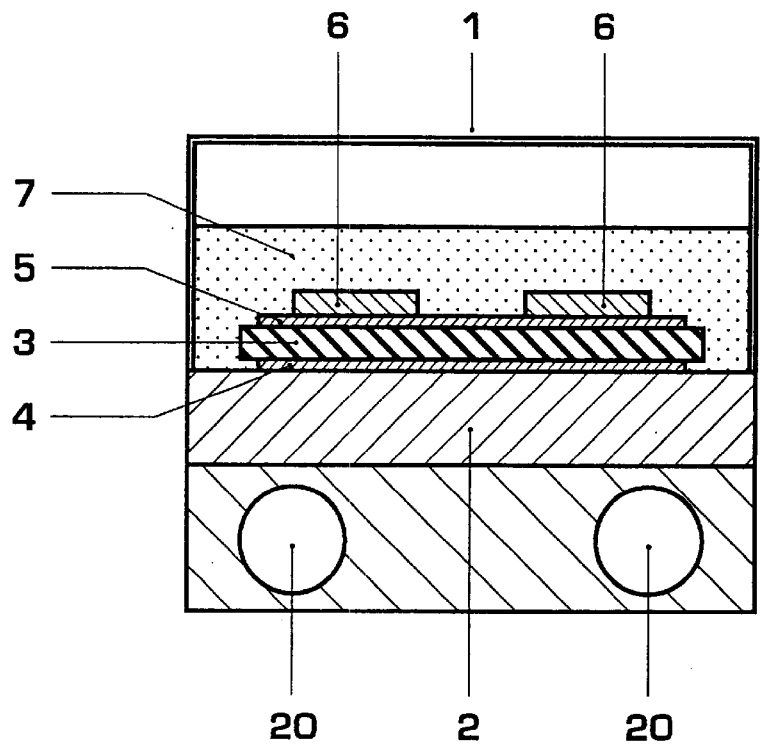
FIG. 1a shows a cross section through a diagrammatically illustrated semiconductor module including its housing in accordance with the prior art.
Figure 1B:
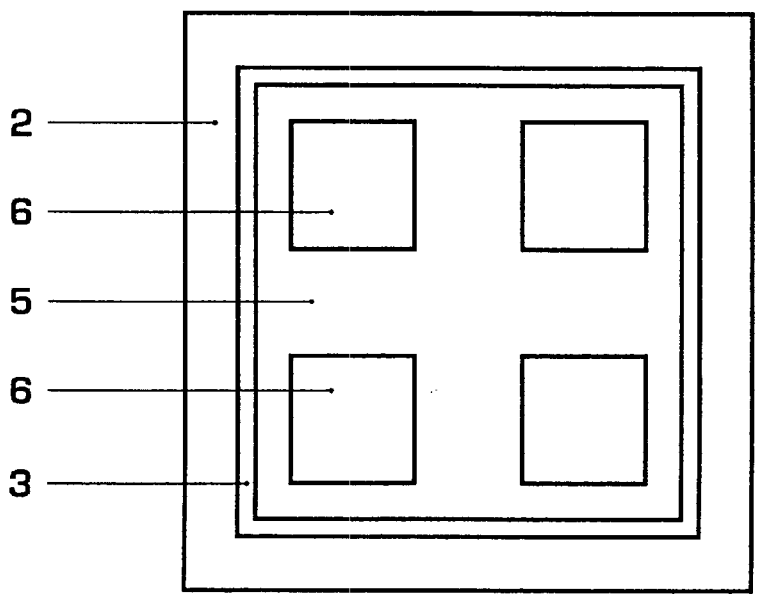
FIG. 1b shows a plan view of the semiconductor module as shown in FIG. 1a without the housing.
Figure 2:
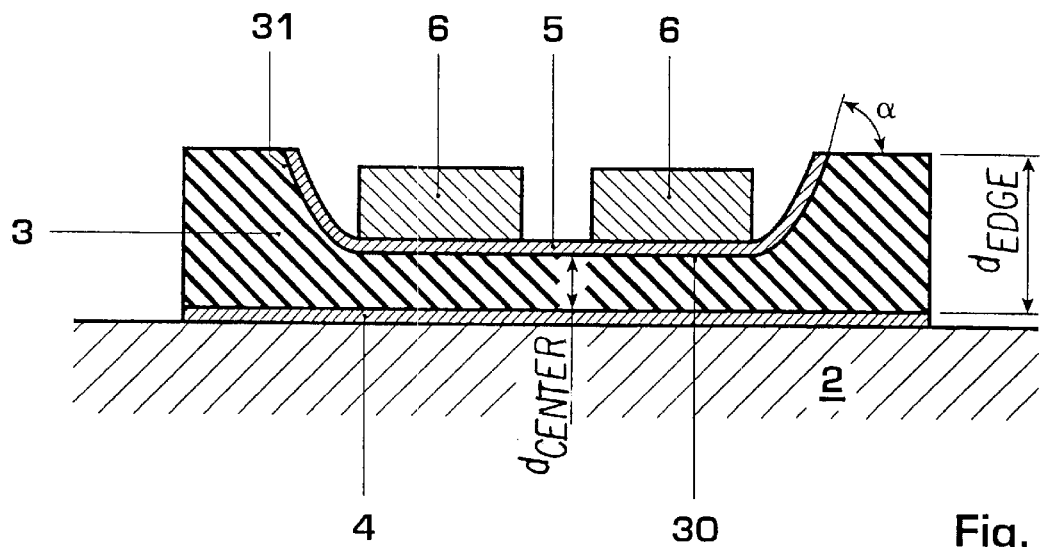
FIG. 2 shows a cross section through a first embodiment of a semiconductor module according to the invention.

FIG. 2 illustrates a first exemplary embodiment of a semiconductor module according to the invention. It essentially comprises a base or cooling element 2, at least one chip or semiconductor element 6 and at least one substrate or insulation element 3 coated with metal on two sides. On account of the greatly enlarged scale, the base 2 and semiconductor elements 6 are only partly illustrated.

The insulation element 3, generally a ceramic plate, has a depression 30 on one side, preferably—as illustrated here—on the side facing the semiconductor elements 6. This depression 30 is designed in the shape of a well, at least two sides, preferably all of the sides, being raised. In this case, said depression is flat in the center zone and has steep lateral sidewalls 31. Typically, the depth of the well is at least half the thickness of the insulation element 3 and the sidewalls 31 form an angle α of at least 30° with the surface of the insulation element 3. In the depression 30 there is a first metal layer 5, which extends over the lateral sidewalls 31. The inner surface of the well-shaped depression forms an equipotential surface, in which case it is not absolutely necessary for this purpose that the entire inner surface be coated with a copper sheet applied by soldering or DCB (direct copper bonding). Generally, it suffices for merely the plane part of the well-shaped depression to be coated with metal in such a way, the layer thickness preferably being between 0.1 and 0.3 mm. The sidewalls 31 may be provided with a vapor-deposited metal layer or another layer, even one having a low electrical conductivity.

The opposite side, facing the base element 2, of the insulation element 3 is preferably designed to be planar and is provided with a plane second metal layer 4. As can be seen in FIG. 2, the distance between the two metal layers increases toward their edges, the distance $d_{edge}$ between the edges being a multiple of the distance $d_{center}$ between the center zones. Typical values are 3–5 mm for $d_{edge}$ and 1–2 mm for $d_{center}$. The increased distance reduces the excessive field increase that can be produced in the edge regions.

Figure 3:
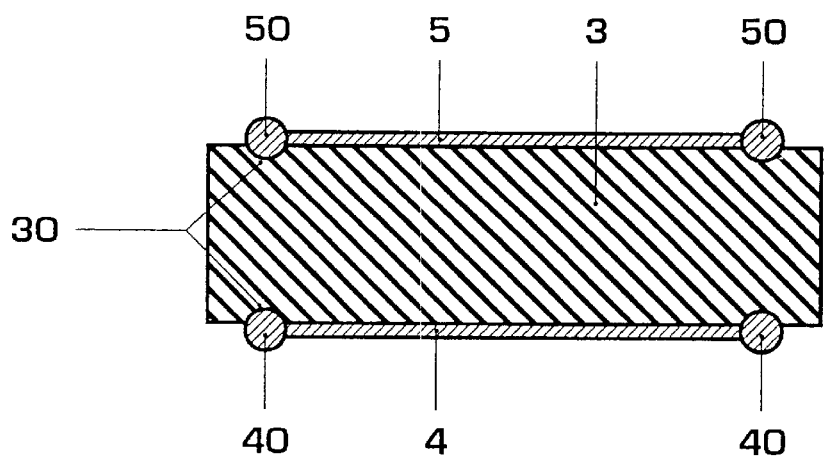
FIG. 3 shows a cross section through an insulation element according to a second embodiment of the semiconductor module according to the invention.

FIG. 3 shows a second embodiment according to the invention. In this case, the insulation element 3 is designed to be essentially plane-parallel and is provided with two essentially plane, mutually opposite metal layers 4, 5 having curved portions in the form of bead-shaped terminations 40, 50 at their corners and/or edges. These bead-shaped terminations 40, 50 preferably have a round cross section and have a diameter which is a multiple of the thickness of the metal layer. Typical values are 0.2–0.3 mm for the thickness of the metal layer and 1–4 mm for the diameter of the bead. The bead-shaped terminations 40, 50 alleviate the corners or edges and thus likewise reduce the excessive field increase.

In the exemplary embodiment illustrated here, the metal layers 4, 5 bear on the plane surface of the insulation element 3, only the bead-shaped terminations 40, 50 being accommodated in depressions 30.

Figure 4:
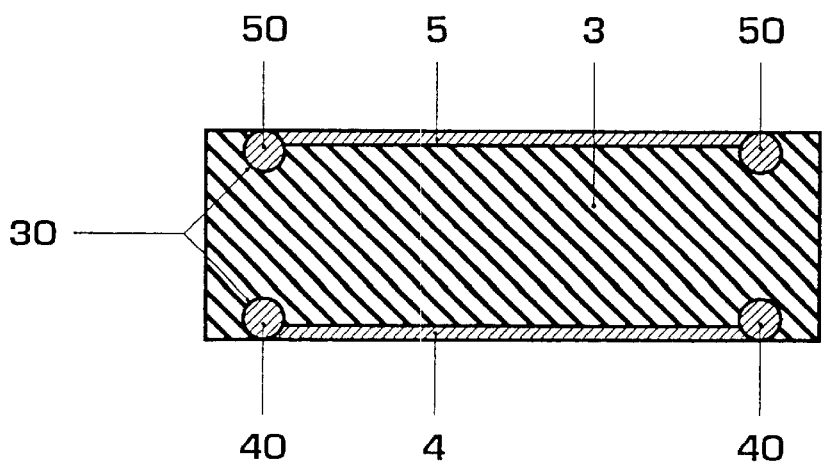
FIG. 4 shows a cross section through an insulation element according to a third embodiment.

In the exemplary embodiment as shown in FIG. 4, on the other hand, the metal layers 4, 5 are completely incorporated into a correspondingly shaped depression in the insulation element 3, and they form a common plane surface with the latter.

The semiconductor module according to the invention, with the curved metalization layers of the insulation elements, leads to a reduction in the excessive field increases and, by virtue of an increased insulation capability, increases the power range of semiconductor modules.

List of Reference Symbols

1 Module housing
2 Base element
20 Water cooling arrangement
3 Insulation element
30 Depression
31 Lateral sidewall
4 Second metal layer
40 Bead-shaped termination
5 First metal layer
50 Bead-shaped termination
6 Semiconductor element
7 Gel
$d_{edge}$ Distance between the edges
$d_{center}$ Distance between the center zones
α Angle between sidewall and bottom of well

What is claimed is:

1. A semiconductor module comprising:
   a base element;
   at least one insulation element arranged on the base element, the at least one insulation element having a first metal layer on one side and a second metal layer on an opposite side; and
   at least one semiconductor element arranged on the at least one insulation element,
   wherein the at least one insulation element is configured as a plate, at least one depression for accommodating a curved portion of one of the first and second metal layers is formed into the at least one insulation element, one of the first and second metal layers with the curved portion has a shape of a well, and a distance between the first and second metal layers increases toward edges of the first and second metal layers.

2. The semiconductor module as claimed in claim 1, wherein the at least one insulation element has, at least on one of the one and opposite sides, the at least one depression which is well-shaped with lateral sidewalls, the one of the first and second metal layers with the curved portion being arranged in the at least one depression and extending over the lateral sidewalls.

3. The semiconductor module as claimed in claim 2, wherein the one side of the at least one insulation element has the at least one depression and the opposite side of the at least one insulation element is planar, the first metal layer being on the one side and the second metal layer being on the opposite side.

4. The semiconductor module as claimed in claim 2 or 3, wherein a distance $d_{edge}$ between the edges of the first and second metal layers is a multiple of a distance $d_{center}$ between center zones of the first and second metal layers.

5. A semiconductor module comprising:
   a base element;
   at least one insulation element arranged on the base element, the at least one insulation element having a first metal layer on one side and a second metal layer on the opposite side; and
   at least one semiconductor element arranged on the at least one insulation element,
   wherein at least one of the first and second metal layers has curved portions at corners and/or edges, and wherein each one of the curved portions has a shape of a bead.

6. The semiconductor module as claimed in claim 5, wherein the at least one insulation element has a plane surface interrupted by depressions for accommodating the bead-shaped curved portions at the corners and/or edges of the at least one of the first and second metal layers, and wherein the at least one of the first and second metal layers with the curved portions, except the bead-shaped curved portions at the corners and/or edges, bears on the plane surface.

7. The semiconductor module as claimed in claim 5, wherein the corners and/or edges have an at least approximately round cross section.

8. The semiconductor module as claimed in claim 5, wherein the at least one of the first and second metal layers with the curved portions is incorporated completely into the at least one insulation element, forming a common plane surface with the at least one insulation element.

* * * * *